(12) United States Patent
Yamada (10) Patent No.: US 8,395,189 B2
(45) Date of Patent: Mar. 12, 2013

(54) SEMICONDUCTOR INTEGRATED CIRCUIT DEVICE

(75) Inventor: Junichi Yamada, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 560 days.

(21) Appl. No.: 12/656,694

(22) Filed: Feb. 12, 2010

(65) Prior Publication Data

US 2010/0207169 A1 Aug. 19, 2010

(30) Foreign Application Priority Data

Feb. 16, 2009 (JP) ................................. 2009-033046

(51) Int. Cl.
H01L 27/118 (2006.01)
(52) U.S. Cl. .. 257/203; 257/202; 257/208; 257/E27.062
(58) Field of Classification Search .................. 257/202, 257/203, 208, E27.062
See application file for complete search history.

(56) References Cited

U.S. PATENT DOCUMENTS 7,187,573 B2 3/2007 Terada et al.

FOREIGN PATENT DOCUMENTS

JP 2005-174520 6/2005

*Primary Examiner* — Tan N Tran
(74) *Attorney, Agent, or Firm* — McGinn IP Law Group, PLLC (57) ABSTRACT

A semiconductor integrated circuit includes a group of wirings routed at first to Nth (N being an integer not less than two) wiring positions sequentially arranged in parallel, each of the wirings being divided into two portions comprising a starting end side and a terminating end side; and an Mth buffer circuit that connects the starting end side of the wiring at the Mth wiring position (M being an integer that satisfies $1 \leq M \leq K$, wherein K is an integer that satisfies $K \leq N/2$) as an input and the terminating end side of the wiring at the (M+N−K)th wiring position as an output. The group of the wirings has a structure in which connection is switched so that the starting end side of the wiring at a Jth (J being an integer that satisfies $K < J \leq N$) wiring position is routed to the terminating end side of the wiring at a (J−K)th wiring position on a wiring layer above a placement region of the buffer circuit(s). Chip occupying area of the group of wirings and the buffer circuit is reduced.

9 Claims, 7 Drawing Sheets

SEMICONDUCTOR INTEGRATED CIRCUIT DEVICE

REFERENCE TO RELATED APPLICATION

This application is based upon and claims the benefit of the priority of Japanese patent application No. 2009-033046, filed on Feb. 16, 2009, the disclosure of which is incorporated herein in its entirety by reference thereto.

The present invention relates to a semiconductor integrated circuit device. More specifically, the invention relates to a placement and routing technique for the semiconductor integrated circuit device.

TECHNICAL FIELD

1. Background

In recent years, with an increase in the sizes of semiconductor integrated circuit devices, ASICs (Application Specific Integrated Circuits) have been developed. In the ASICs, a lot of major functions of embedded system products are integrated into a chip. Various circuits such as analog circuits, memories such as DRAM, and flash memories are mounted on the ASIC. Such functional blocks often occupy a large placement space within an LSI. For this reason, when a wiring outside a functional block is routed interposing the functional block, the routing is performed by bypassing the functional block or over the functional block.

Generally, the functional block has a large circuit size. Thus, when the routing is performed interposing the functional block, it is often necessary to insert a buffer circuit(s) into the wiring(s). Patent Document 1 therefore describes an example where memory circuits and a logic circuit are mounted as functional blocks and feed-through wirings are provided on the memory circuits. In the example, memory cells are arranged, and buffer circuits are interposed (in a region where no memory cells are arranged) between regions of the memory cells.

[Patent Document 1]
  JP Patent Kokai Publication No. JP-P2005-174520A

SUMMARY

The entire disclosure of Patent Document 1 is incorporated herein by reference thereto.

The following analysis is given by the present invention.

Generally, the buffer circuit is formed of a CMOS circuit. In order to place and route one buffer circuit, a region of several pitches of wirings is needed. When the number of feed-through wirings is increased, the area of a buffer circuit placement region is proportionally increased. For this reason, the width or height of the region where no memory cells are arranged is increased. A chip occupied area including a waste area is therefore increased. Accordingly, here is much desired in the art.

According to one aspect of the present invention, there is provided a semiconductor integrated circuit device comprising:

a group of wirings routed at first to Nth (N being an integer not less than two) wiring positions sequentially arranged in parallel, each of the wirings being divided into two portions comprising a starting end side and a terminating end side; and an Mth buffer circuit that connects the starting end side of the wiring at the Mth wiring position (M being an integer that satisfies $1 \leq M \leq K$, wherein K is an integer that satisfies $K \leq N/2$) as an input and the terminating end side of the wiring at the (M+N−K)th wiring position as an output.

The group of the wirings has a structure in which connection is switched so that the starting end side of the wiring at a Jth (J being an integer that satisfies $K<J \leq N$) wiring position is routed to the terminating end side of the wiring at a (J−K)th wiring position on a wiring layer above a placement region of the buffer circuit(s).

The meritorious effects of the present invention are summarized as follows.

According to the present invention, the group of wirings has the structure in which routing is performed by making connection switching on the wiring layer above the placement region of the buffer circuit(s). The chip occupying area of the group of wirings and the buffer circuit(s) can be thereby reduced.

PREFERRED MODES

A semiconductor integrated circuit device according to an exemplary embodiment of the present invention comprises:

a group of wirings routed at first to Nth (N being an integer not less than two) wiring positions sequentially arranged in parallel, each of the wirings being divided into two portions comprising a starting end side and a terminating end side; and an Mth buffer circuit that connects the starting end side of the wiring at the Mth wiring position (M being an integer that satisfies $1 \leq M \leq K$, wherein K is an integer that satisfies $K \leq N/2$) as an input and the terminating end side of the wiring at the (M+N−K)th wiring position as an output;

wherein group of the wirings has a structure in which connection is switched so that the starting end side of the wiring at the Jth (J being an integer that satisfies $K<J \leq N$) wiring position is routed to the terminating end side of the wiring at the (J−K)th wiring position on a wiring layer above a placement region of the buffer circuit(s).

The semiconductor integrated circuit device may comprise multiple stages of the wirings and the buffer circuit, and the multiple stages may be formed by connecting the terminating end side of the wirings and the buffer circuit(s) of one stage to the starting end side of the wirings of a subsequent stage.

N may be integer times of K, and the number of the multiple stages may be N/K.

The buffer circuit may include an inverter circuit comprising a CMOS structure in which mutually complementary two transistors are formed in a direction of the wiring position(s).

The buffer circuit may have a configuration in which two of inverter circuits are disposed adjacent to each other in a direction orthogonal to the direction of the wiring position(s) and the two inverter circuits are connected in series.

The buffer circuit may have a configuration in which two of inverter circuits are disposed adjacent to each other in the direction of the wiring position(s)and the two inverter circuits are connected in series.

The semiconductor integrated circuit device may comprise:

a plurality of functional blocks arranged in an array form, the functional blocks having a same structure;

each of the functional blocks including the group of the wirings and the buffer circuit(s) of one stage.

The functional block may comprise a memory cell array and a selection circuit that selects a memory cell of the memory cell array; and the selection circuit may include the group of the wirings and the buffer circuit(s) of one stage.

The functional block may comprise a memory cell array and a control circuit that controls selection of a memory cell of the memory cell array; and the control circuit may include the group of the wirings and the buffer circuit(s) of one stage.

In the semiconductor integrated circuit device as described above, the group of wirings has a structure in which routing is performed by making connection switching on the wiring layer above the placement region of the buffer circuit(s). The chip occupying area of the group of wirings and the buffer circuit(s) can be thereby reduced. For this reason, when the plurality of functional blocks having the same structure arranged in the array form are in particular included, the buffer circuits can be distributed and placed in the respective functional blocks, without providing a region for exclusively placing the buffer circuits. The buffer placement region of a same structure, in which the group of wirings and the buffer circuit(s) are disposed, is repeatedly placed. Thus, placement and routing is simple, leading to chip cost reduction.

A detailed description will be given below in connection with exemplary embodiments, with reference to drawings.

First Exemplary Embodiment

Figure 1:
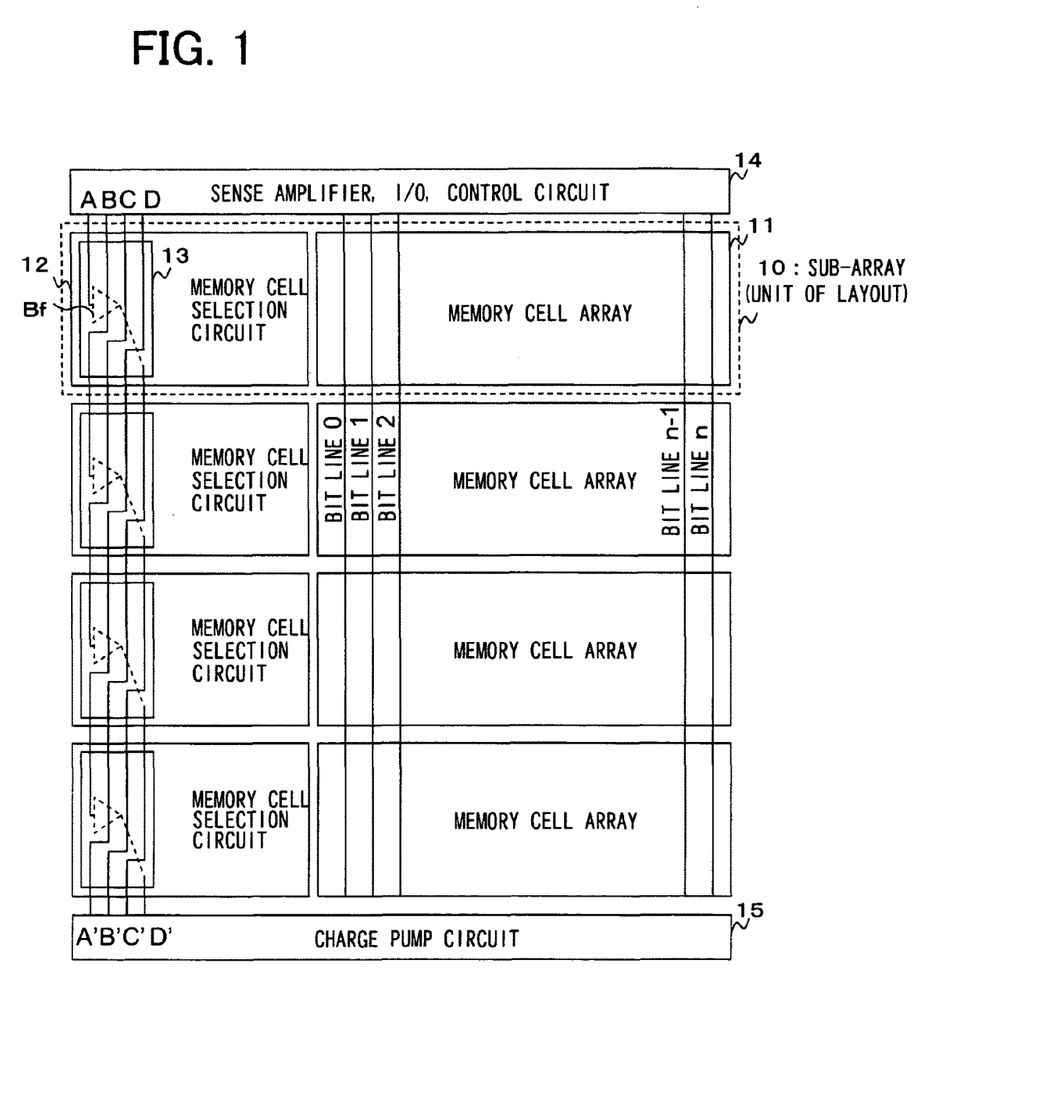
FIG. 1 is a diagram showing a configuration of a semiconductor integrated circuit device according to a first exemplary embodiment of the present invention.

FIG. 1 is a diagram showing a configuration of a semiconductor integrated circuit device according to a first exemplary embodiment of the present invention. Referring to FIG. 1, the semiconductor integrated circuit device includes four sub-arrays 10, a sense amplifier I/O control circuit 14 (hereinafter just referred to as a control circuit 14), and a charge pump circuit 15. Each sub-array 10 includes a memory array 11 and a memory cell selection circuit 12. A buffer placement region 13 is provided in the memory cell selection circuit 12. A buffer circuit Bf is present in the buffer placement region 13.

Bit lines 0 to n are routed from the control circuit 14 to the memory cell array 11 of each sub-array 10. Wirings A to D are routed from the control circuit 14 to the charge pump circuit 15 through the buffer placement region 13 of the memory cell selection circuit 12 of each sub-array 10. In the sub-array 10 in an uppermost stage, the wiring A is routed to the sub-array 10 in the next stage through the buffer circuit Bf. Herein, functions and operations of the memory cell array 11, the memory cell selection circuit 12, the control circuit 14, and the charge pump circuit 15 are related to those of a common memory that has been hitherto known. The functions and operations are not related to the present invention. Thus, descriptions of these functions and operations will be omitted.

Figure 2:
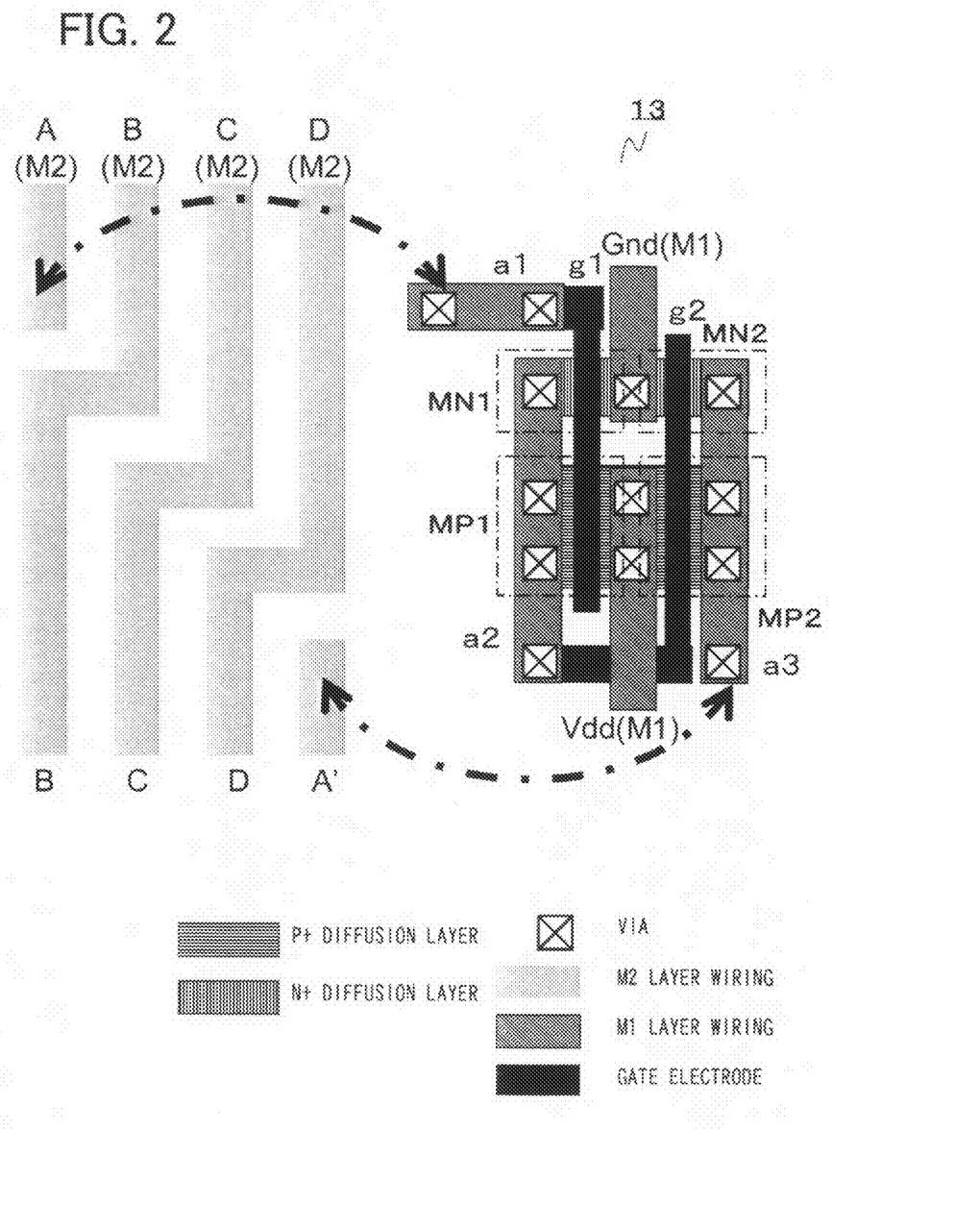
FIG. 2 is a diagram showing a structure of a buffer placement region.

FIG. 2 is a diagram showing a structure of the buffer placement region. Referring to FIG. 2, the wirings A, B, C, and D, and a wiring A' are placed on an M2 layer of the buffer placement region 13. The M2 layer is a metal wiring layer. In this case, with respect to parallel positions (layout) of the wirings sequentially disposed from the left of the page of FIG. 2, the wiring A and the terminating end side of the wiring B, the starting end side of the wiring B and the terminating end side of the wiring C, the starting end side of the wiring C and the terminating end side of the wiring D, and the starting end side of the wiring D and the wiring A' are sequentially laid out in an arrayed pattern above the buffer placement region 13 at minimum pitches.

Wirings a1, a2, and a3, Vdd, and Gnd are placed on an M1 layer. The M1 layer is a metal wiring layer below the M2 layer. Further, a P+ diffusion layer and an N+ diffusion layer are formed in a semiconductor substrate below the M1 layer. MOS transistors are placed on the P+ diffusion layer and the N+ diffusion layer. Gate electrodes (gate poly wirings) g1 and g2 are formed over the P+ diffusion layer and the N+ diffusion layer.

An NMOS transistor MN1 is formed on the N+ diffusion layer, with its side connected to the wiring a2 through a via (contact plug) used as a drain thereof, with its side connected to the wiring GND through a via (contact plug) used as a source thereof, and with the gate electrode g1 being used as a gate thereof.

An NMOS transistor MN2 is formed on the N+ diffusion layer, with its side connected to the wiring a3 through a via (contact plug) used as a drain thereof, with its side connected to the wiring GND through the via (contact plug) used as a source thereof, and with the gate electrode g2 used as a gate thereof.

A PMOS transistor MP1 is formed on the P+ diffusion layer, with its side connected to the wiring a2 through vias (contact plugs) used as a drain thereof, with its side connected to the wiring Vdd through vias (contact plugs) used as a source thereof, and with the gate electrode g1 being used as a gate thereof.

A PMOS transistor MP2 is formed on the P+ diffusion layer, with its side connected to the wiring a3 through vias (contact plugs) used as a drain thereof, with its side connected to the wiring Vdd through the vias (contact plugs) used as a source thereof, and with the gate electrode g2 used as a gate thereof.

The wiring A is connected to the wiring a1 through a via, and is further connected to the gate electrode g1 through a via. The wiring a2 is connected to the gate electrode g2 through a via. The wiring A' is connected to the wiring a3 through a via.

In the configuration as described above, the NMOS transistor MN1 and the PMOS transistor MP1 constitute a first inverter circuit, and the NMOS transistor MN2 and the PMOS transistor MP2 constitute a second inverter circuit that inverts an output signal of the first inverter circuit.

A signal on the wiring A is buffered by the buffer circuit Bf formed of the two inverter circuits and is then output to the wiring A'.

In this case, the wiring A is connected to the wiring A' that is separated by three wiring pitches through the buffer circuit Bf. The wirings B, C, and D have a structure in which connection is switched so that the starting end side of the wiring is routed to the terminating end side of the wiring that is shifted by one wiring pitch.

The above description was directed to the case where the buffer placement region 13 has a width corresponding to four wiring pitches. However, the buffer circuit Bf can be placed using a width corresponding to three wiring pitches between the wirings a2 and a3.

Thus, the buffer placement region may also be set to have a width corresponding to the three wiring pitches.

Figure 3:
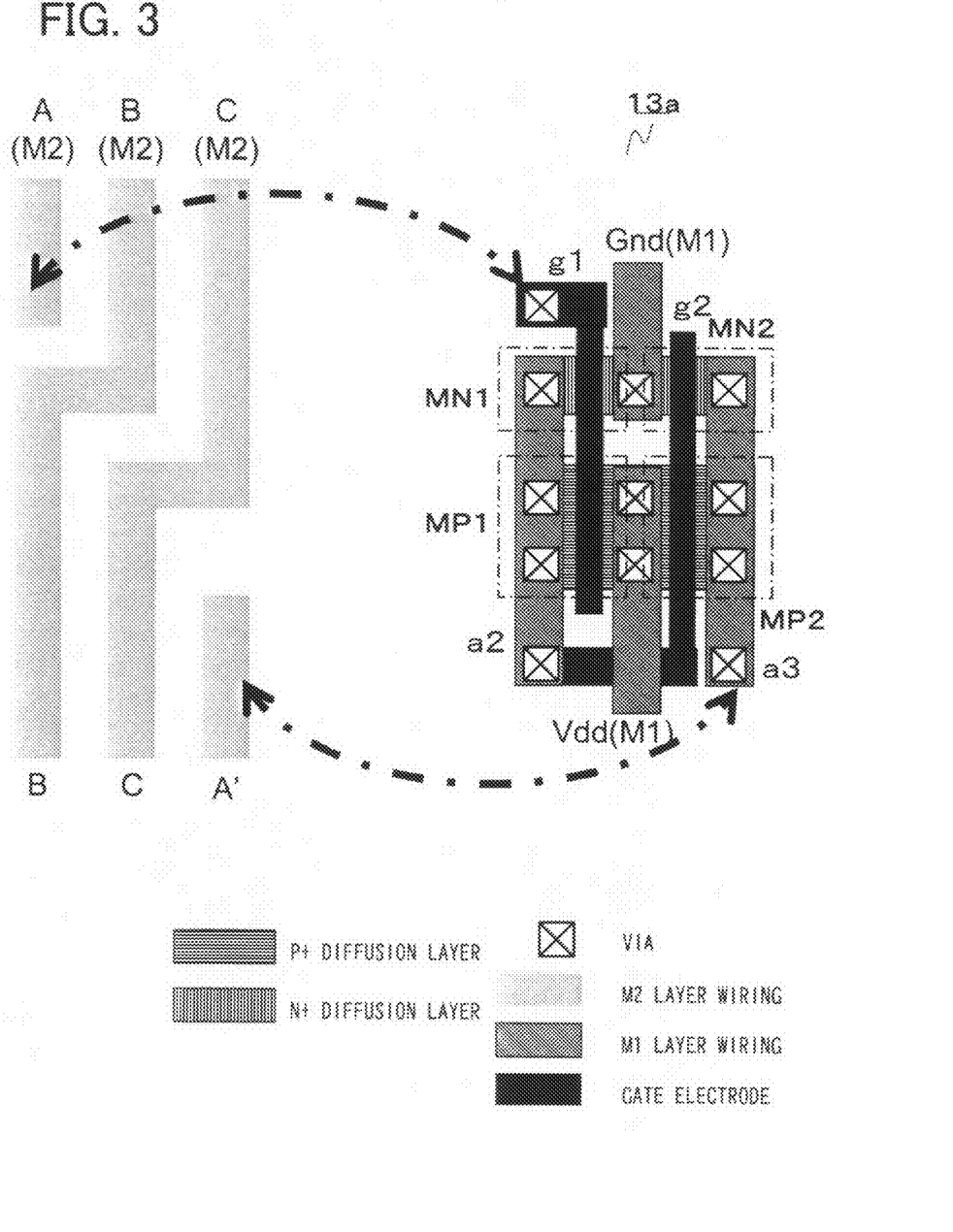
FIG. 3 is a diagram showing another structure of the buffer placement region.

FIG. 3 is a diagram showing another structure of the buffer placement region. Referring to FIG. 3, same reference characters as those in FIG. 2 denote same components. Thus, descriptions of the same components will be omitted. The wirings A, B, C, and A' are placed on the M2 layer of a buffer placement region 13a. The M2 layer is the metal wiring layer. In this case, with respect to positions of the wirings sequentially disposed from the left of the page of FIG. 3, the wiring A and the terminating end side of the wiring B, the starting end side of the wiring B and the terminating end side of the wiring C, the starting end side of the wiring C and the wiring A' are sequentially placed above the buffer placement region 13a at minimum pitches.

The wiring a1 is omitted from the M1 layer that is the metal wiring layer below the M2 layer. The wiring A is thus directly connected to the gate electrode g1 through a via. When placing the buffer placement region as described above, it is enough to provide the width of the three wiring pitches or more.

The buffer placement region as described above is disposed for each sub-array, as shown in FIG. 1, and then, connection switching (rotation) of the wirings is performed for each passage of the sub-array. With such an arrangement, the chip occupying area of the wirings and the buffer circuit can be reduced. In this case, without providing a region for exclusively placing the buffer circuits, the buffer circuits can be distributed and placed in respective functional blocks. The buffer placement region of a same structure is repeatedly placed. Thus, placement and routing is simple.

Second Exemplary Embodiment

Figure 4:
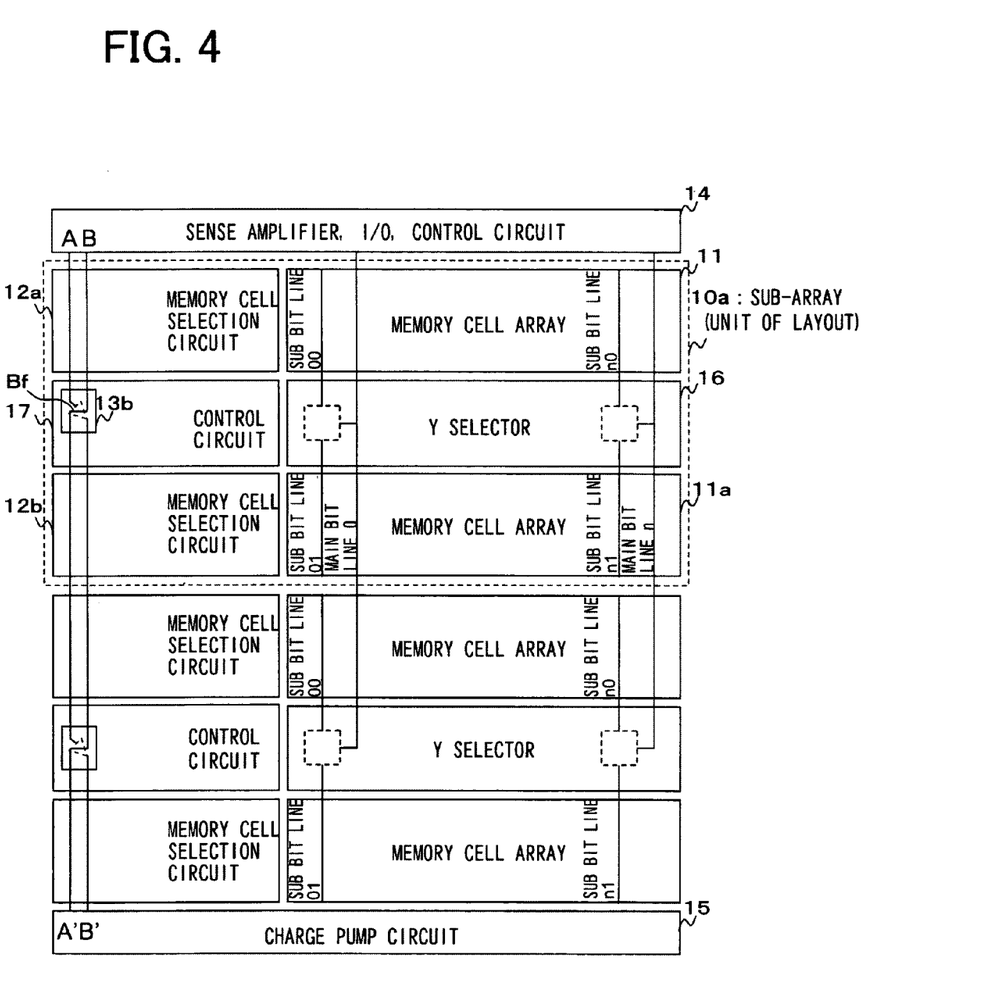
FIG. 4 is a diagram showing a configuration of a semiconductor integrated circuit device according to a second exemplary embodiment of the present invention.

FIG. 4 is a diagram showing a configuration of a semiconductor integrated circuit device according to a second exemplary embodiment of the present invention. Referring to FIG. 4, same reference characters as those in FIG. 1 denote same components. Thus, description of the same components will be omitted. The semiconductor integrated circuit device includes two sub-arrays 10a. Each sub-array 10a includes memory cell arrays 11 and 11a, memory cell selection circuits 12a and 12b, a Y selector 16, and a control circuit 17. A buffer placement region 13b is provided in the control circuit 17. The buffer circuit Bf is present in the buffer placement region 13b.

Main bit lines 0 to n are routed from the control circuit 14 to the Y selector 16 of each sub-array 10a. Sub-bit lines 00 to n0 (in which n is one of integers 1 to n) and sub-bit lines 01 to n1 (in which n is one of integers 1 to n) are respectively routed to the memory cell array 11 and the memory cell array 11a, from the Y selector 16. Sub-bit line pairs such as the sub-bit lines 00 and 01 and sub-bit lines n0 and n1 are routed, corresponding to the respective main bit lines 0 to n. The wirings A and B are routed from the control circuit 14 to the charge pump circuit 15 through the buffer placement region 13b of the control circuit 17 of each sub-array 10a. In the sub-array 10a in an uppermost stage, the wiring A is routed to the sub-array 10a in the next stage through the buffer circuit Bf. Herein, functions and operations of the memory cell arrays 11 and 11a, memory cell selection circuits 12a and 12b, control circuits 14 and 17, Y selector 16, and charge pump circuit 15 may relate to those of a commonplace memory, in general, that has been hitherto known. The functions and operations are not related to the present invention. Thus, descriptions of these functions and operations will be omitted.

Figure 5:
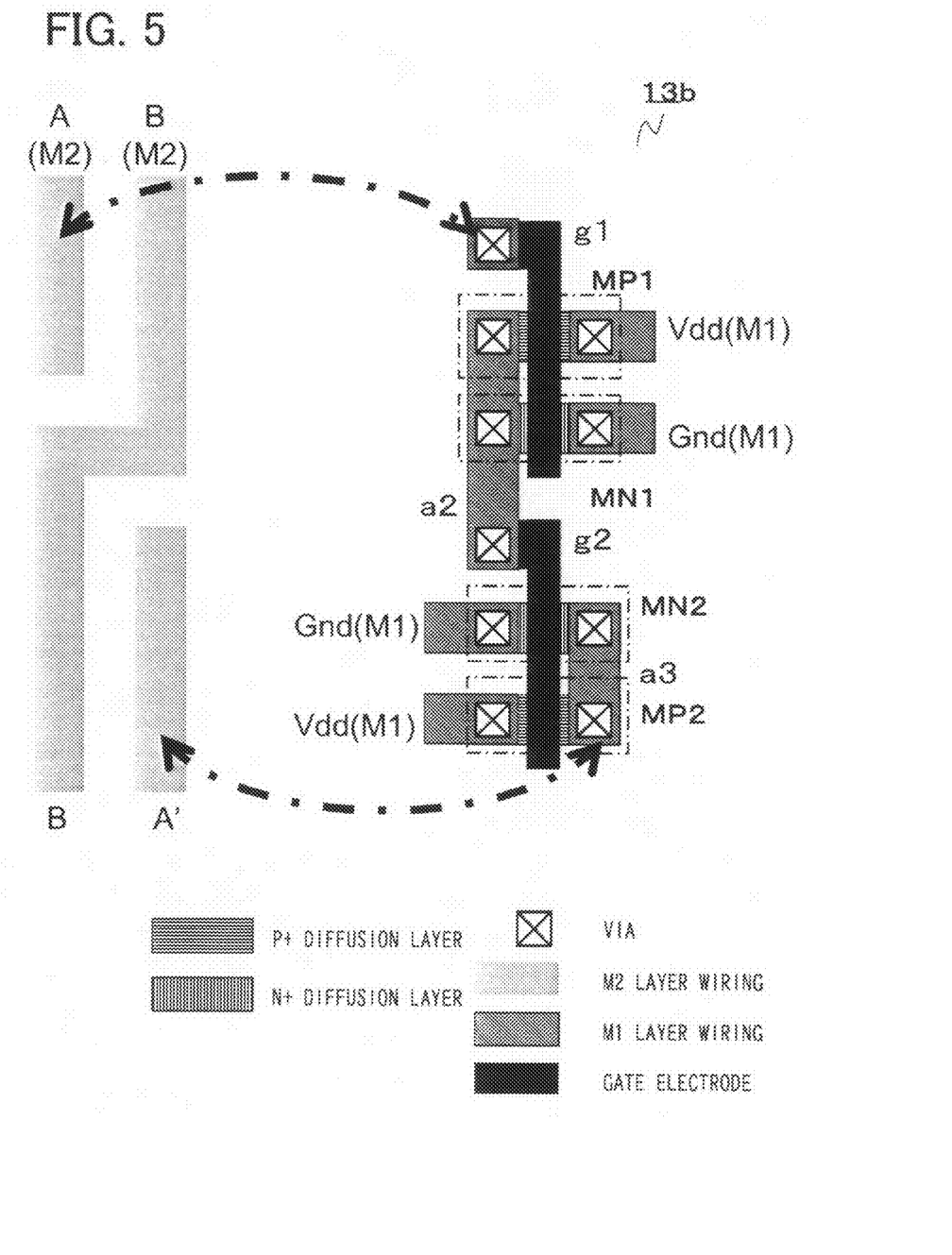
FIG. 5 is a diagram showing still another structure of the buffer placement region.

FIG. 5 is a diagram showing still another structure of the buffer placement region. Referring to FIG. 5, same reference characters as those in FIG. 2 denote same components. Thus, descriptions of the same components will be omitted. The wirings A, B, and A' are placed on the M2 layer of the buffer placement region 13b. The M2 layer is the metal wiring layer.

In this case, with respect to positions of the wirings sequentially disposed from the left of the page of FIG. 5, the wiring A and the terminating end side of the wiring B and the starting end side of the wiring B and the wiring A' are sequentially placed above the buffer placement region 13b at minimum pitches. The wiring a1 is omitted from the M1 layer that is the metal wiring layer below the M2 layer. The wiring A is thus directly connected to the gate electrode g1 through a via.

Referring to FIG. 5, connection of the transistors is the same as in FIGS. 2 and 3. However, placement of the transistors is different. That is, in FIGS. 2 and 3, the two inverter circuits are disposed adjacent to each other in a direction orthogonal to the direction of positions of the wirings, and the two inverter circuits are connected in series. In contrast therewith, in the buffer circuit Bf in FIG. 5, the two inverter circuits are disposed adjacent to each other in the direction of positions of the wirings, and the two inverter circuits are connected in series.

When placing the buffer placement region as shown in FIG. 5, it is enough to provide a width of two wiring pitches or more. The buffer placement region as described above is disposed for each sub-array, as shown in FIG. 4, and then, connection switching of the wirings is performed for each passage of the sub-array. The chip occupying area of the wirings and the buffer circuit can be thereby reduced.

Third Exemplary Embodiment

Figure 6:
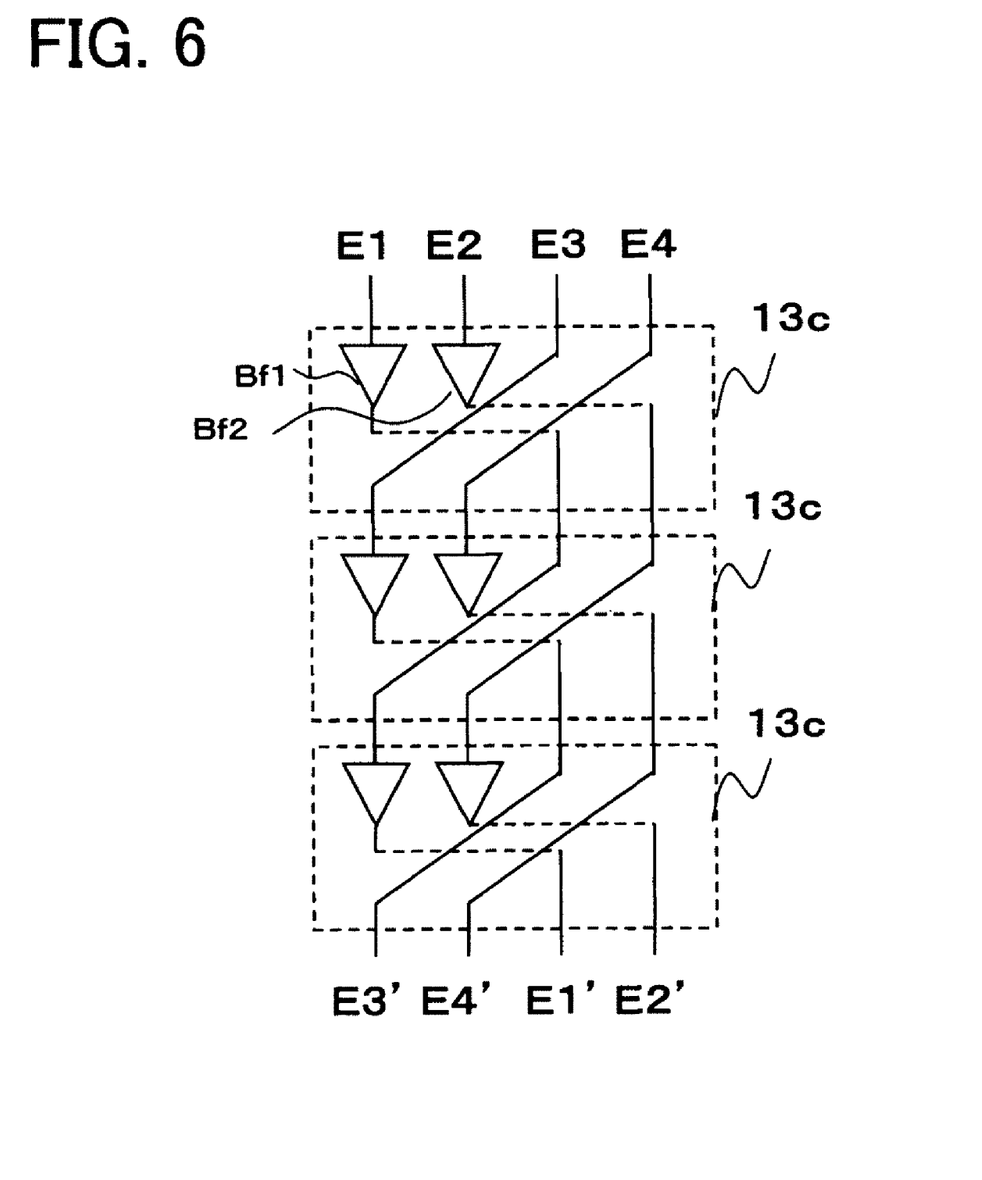
FIG. 6 is a diagram showing a configuration of a buffer placement region according to a third exemplary embodiment of the present invention.

FIG. 6 is a diagram showing a configuration of a buffer placement region according to a third exemplary embodiment of the present invention. Referring to FIG. 6, wirings E1 to E4 are placed on an M2 layer of a buffer placement region 13c. The M2 layer is a metal wiring layer. In this case, with respect to parallel positions of the wirings sequentially disposed from the left of the page of FIG. 6, the wiring E1 and the terminating end side of the wiring E3, the wiring E2 and the terminating end side of the wiring E4, the starting end side of the wiring E3 and the terminating end side of the wiring E1, and the starting end side of the wiring E4 and the terminating end side of the wiring E2 are sequentially placed above the buffer placement region 13c at minimum pitches. The wiring E1 is connected to the terminating end side of the wiring E1 through a buffer circuit Bf1. The wiring E2 is connected to the terminating end of the wiring E2 through a buffer circuit Bf2. Assume that each of the buffer circuit Bf1 and the buffer circuit Bf2 is formed to be in the buffer placement region as shown in FIG. 5, which occupies two wiring pitches. Then, the width of the buffer placement region 13c can be formed to be a width of four wiring pitches, which is the occupying width of the wirings.

Herein, there is shown an example where the number of arrays is set to three, and each of the wirings E1 and E2 is routed through two stages of the buffer circuit. When the number of arrays is set to two, all of the wirings E1 to E4 are routed through one-stage buffer circuit.

In the buffer placement region 13c as described above, connection can also be switched to the wiring that is shifted by two wiring pitches.

Fourth Exemplary Embodiment

Figure 7:
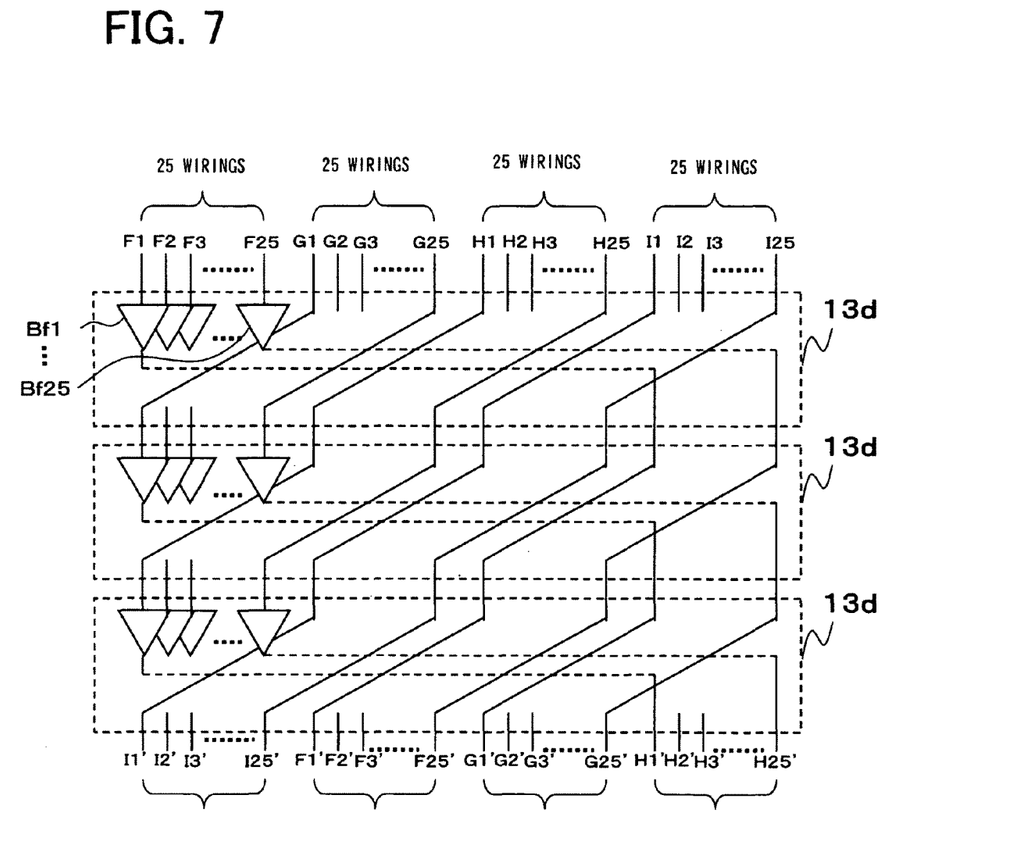
FIG. 7 is a diagram showing a configuration of a buffer placement region according to a fourth exemplary embodiment of the present invention.

FIG. 7 is a diagram showing a configuration of a buffer placement region according to a fourth exemplary embodiment of the present invention. Referring to FIG. 7, wirings F1 to F25, G1 to G25, H1 to H25, and I1 to I25, which are 100 wirings, are placed on an M2 layer of a buffer placement region 13d. The M2 layer is a metal wiring layer. In this case, with respect to parallel positions of the wirings sequentially disposed from the left of the page of FIG. 7, the wiring F1 and the terminating end side of the wiring G1, the wiring F2 and the terminating end side of the wiring G2, . . . the wiring F25 and the terminating end side of the wiring G25, and the starting end side of the wiring G1 and the terminating end side of the wiring H1, and the starting end side of the wiring G2 and the terminating end side of the wiring H2, . . . the starting end side of the wiring G25 and the terminating end side of the wiring H25, the starting end side of the wiring H1 and the terminating end side of the wiring I1, the starting end side of the wiring H2 and the terminating end side of the wiring I2, . . . the starting end side of the wiring H25 and the terminating end side of the wiring I25, the starting end side of the wiring I1 and the terminating end side of the wiring F1, the starting end side of the wiring I2 and the terminating end side of the wiring F2, . . . and the starting end side of the wiring I25 and the terminating end side of the wiring F25 are sequentially placed above the buffer placement region 13d at minimum pitches. The wirings F1 to F25 are connected to the terminating end sides of the wirings F1 to F25 through buffer circuits Bf1 to Bf25, respectively. Assume that each of the buffer circuits Bf1 to Bf25 is disposed in a region of a width corresponding to four wiring pitches or less. Then, the buffer placement region 13d can be set to have a width corresponding to 100 wiring pitches, which is the occupying width of the wirings.

Herein, there is shown an example where the number of arrays is set to three, and the wirings I1 and I25 are routed not through buffer circuits. When the number of arrays is set to four, all of the 100 wirings are routed through the buffer circuits.

In the buffer placement region 13d as described above, wiring connection can be switched to the wiring that is shifted by 25 wiring pitches. As described above, the structure of switching wiring connection may be changed in various ways, as necessary.

The above description was directed to the case where the buffer circuit is formed of two stages of the inverter circuits. The present invention, however, is not limited to this configuration. The buffer circuit may be formed of one inverter circuit alone. In this case, it may be so configured that a signal is passed through two inverter circuits by passing through two sub-arrays.

The description has been directed to the case in which a functional block is a memory circuit in the form of a divided sub-array. The present invention, however, is not limited to this configuration. The invention may also be similarly applied to a case of an ASIC where same functional blocks are arranged in an array form for load distribution. This ASIC is used for a network communication device and an image device for which high-speed processing is demanded.

Disclosure of Patent Document listed above is incorporated herein by reference. Modifications and adjustments of the exemplary embodiment and the examples are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A semiconductor integrated circuit device comprising:
   a group of wirings routed at first to Nth (N being an integer not less than two) wiring positions sequentially disposed in parallel, each of the wirings being divided into two portions comprising a starting end side and a terminating end side; and
   an Mth buffer circuit that connects the starting end side of the wiring at the Mth wiring position (M being an integer that satisfies $1 \leq M \leq K$, wherein K is an integer that satisfies $K \leq N/2$) as an input and the terminating end side of the wiring at the (M+N−K)th wiring position as an output;
   wherein said group of the wirings has a structure in which connection is switched so that the starting end side of the wiring at a Jth (J being an integer. that satisfies $K < J \leq N$) wiring position is routed to the terminating end side of the wiring at a (J−K)th wiring position on a wiring layer above a placement region of the buffer circuit(s).

2. The semiconductor integrated circuit device according to claim 1, wherein
   the semiconductor integrated circuit device comprises multiple stages of the wirings and the buffer circuit, and the multiple stages are formed by connecting a terminating end side of the wirings and the buffer circuit(s) of one stage to a starting end side of the wirings of a subsequent stage.

3. The semiconductor integrated circuit device according to claim 2, wherein
   N is integer times of K, and a number of the multiple stages is N/K.

4. The semiconductor integrated circuit device according to claim 1, wherein
   the buffer circuit includes an inverter circuit comprising a CMOS structure in which mutually complementary two transistors are formed in a direction of the wiring position(s).

5. The semiconductor integrated circuit device according to claim 4, wherein
   the buffer circuit has a configuration in which two of inverter circuits are disposed adjacent to each other in a direction orthogonal to the direction of the wiring position(s) and the two inverter circuits are connected in series.

6. The semiconductor integrated circuit device according to claim 4, wherein
   the buffer circuit has a configuration in which two of inverter circuits are disposed adjacent to each other in the direction of the wiring position(s) and the two inverter circuits are connected in series.

7. The semiconductor integrated circuit device according to claim 1, comprising:
   a plurality of functional blocks arranged in an array form, the functional blocks having a same structure;
   each of the functional blocks including the group of the wirings and the buffer circuit(s) of one stage.

8. The semiconductor integrated circuit device according to claim 7, wherein
   the functional block comprises a memory cell array and a selection circuit that selects a memory cell of the memory cell array; and
   the selection circuit includes the group of the wirings and the buffer circuit(s) of one stage.

9. The semiconductor integrated circuit device according to claim 7, wherein
   the functional block comprises memory cell arrays and a control circuit that controls selection of a memory cell of the memory cell arrays; and
   the control circuit includes the group of the wirings and the buffer circuit(s) of one stage.

* * * * *